US007329477B2

(12) United States Patent
Jung et al.

(10) Patent No.: US 7,329,477 B2
(45) Date of Patent: *Feb. 12, 2008

(54) PROCESS FOR FORMING A FINE PATTERN USING A TOP-COATING COMPOSITION FOR A PHOTORESIST AND PRODUCT FORMED BY SAME

(75) Inventors: Jae Chang Jung, Ichon-shi (KR); Keun Kyu Kong, Kwangju (KR); Hyeong Soo Kim, Ichon-shi (KR); Jin Soo Kim, Taejeon-shi (KR); Cha Won Koh, Seoul (KR); Sung Eun Hong, Sungnam-shi (KR); Geun Su Lee, Ichon-shi (KR); Min Ho Jung, Ichon-shi (KR); Ki Ho Baik, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 118 days.

This patent is subject to a terminal disclaimer.

(21) Appl. No.: 10/993,869

(22) Filed: Nov. 19, 2004

(65) Prior Publication Data
US 2005/0069816 A1  Mar. 31, 2005

Related U.S. Application Data

(60) Division of application No. 10/174,497, filed on Jun. 17, 2002, now Pat. No. 6,984,482, which is a continuation-in-part of application No. 09/577,097, filed on May 24, 2000, now abandoned.

(30) Foreign Application Priority Data

Jun. 3, 1999 (KR) .................................. 99-20538

(51) Int. Cl.
G03F 7/00 (2006.01)
G03F 7/004 (2006.01)
(52) U.S. Cl. ................................. 430/270.1; 430/273.1
(58) Field of Classification Search ............. 430/273.1, 430/270.1
See application file for complete search history.

(56) References Cited

U.S. PATENT DOCUMENTS

| 3,652,273 | A |   | 3/1972 | Htoo |           |
|-----------|---|---|--------|------|-----------|
| 3,895,949 | A |   | 7/1975 | Akamatsu et al. | |
| 4,428,871 | A |   | 1/1984 | Ward et al. | |
| 5,624,789 | A |   | 4/1997 | Rahman et al. | |
| 5,672,577 | A |   | 9/1997 | Lee | |
| 5,750,312 | A | * | 5/1998 | Chandross et al. | 430/273.1 |
| 5,783,362 | A |   | 7/1998 | Wakiya et al. | |
| 5,911,835 | A |   | 6/1999 | Lee et al. | |
| 5,985,519 | A |   | 11/1999 | Kakamu et al. | |
| 6,000,411 | A |   | 12/1999 | Lee | |
| 6,309,789 | B1 | * | 10/2001 | Takano et al. | 430/270.1 |
| 6,764,806 | B2 |   | 7/2004 | Jung et al. | |

FOREIGN PATENT DOCUMENTS

| DE | 44 15 113 A1 | 11/1994 |
|----|--------------|---------|
| EP | 0 275 147 A2 | 7/1988 |
| EP | 0 488 372 A1 | 6/1992 |
| EP | 0 703 499 A1 | 3/1996 |
| EP | 0 751 433 A2 | 1/1997 |
| EP | 0 803 776 A2 | 10/1997 |
| KR | 94-0004723 | 3/1994 |
| KR | 99-003857 | 1/1999 |
| KR | 99-004682 | 1/1999 |
| WO | WO 92/05474 | 4/1992 |

OTHER PUBLICATIONS

W.D. Hinsberg et al., "Influence of Polymer Properties on Airborne Chemical Contamination of Chemically Amplified Resists," SPIE vol. 1925, 1993, pp. 43-52.
Hiroshi Ito et al., "Approach Toward Environmental Stabilization of Chemical Amplification Resists," Journal of Photopolymer Science and Technology, vol. 6, No. 4, 1993, pp. 547-562.
Greg Breyta et al., "The Lithographic Performance and Contamination Resistance of a New Family of Chemically Amplified DUV Photoresists," Journal of Photopolymer Science and Technology, vol. 7, No 3, 1994, pp. 449-460.
Hiroshi Ito et al., "Environmentally Stable Chemical Amplification Positive Resist: Principle, Chemistry, Contamination Resistance, and Lithographic Feasibility," Journal of Photopolymer Science and Technology, vol. 7, No. 3, 1994, pp. 433-448.
Hiroshi Ito, et al., "Annealing Concept for the Design of Environmentally Stable Chemical Amplification Resists," Journal of Photopolymer Science and Technology, vol. 8, No. 4, 1995, pp. 505-518.

(Continued)

Primary Examiner—Amanda Walke
(74) Attorney, Agent, or Firm—Townsend and Townsend and Crew LLP (57) ABSTRACT

The present invention provides a process for using an amine contamination-protecting top-coating composition. Preferably, the amine contamination-protecting top-coating composition of the present invention comprises an amine contamination-protecting compound. Useful amine contamination-protecting compounds include amine derivatives; amino acid derivatives; amide derivatives; urethane derivatives; urea derivatives; salts thereof; and mixtures thereof. The amine contamination-protecting top-coating composition of the present invention reduces or eliminates problems such as T-topping due to a post exposure delay effect and/or difficulties in forming a fine pattern below 100 nm due to acid diffusion associated with conventional lithography processes involving a photoresist polymer containing an alicyclic main chain using a light source, such as KrF (248 nm), ArF (193 nm), $F_2$ (157 nm), E-beam, ion beam and extremely ultraviolet (EUV).

7 Claims, 10 Drawing Sheets

OTHER PUBLICATIONS

Yoshio Kawai et al., "Environmental Stability of a KrF Chemically Amplified Positive Resist with an Organic Base," Journal of Photopolymer Science and Technology, vol. 8, No. 4, 1995, pp. 535-542.

Satoshi Saito et al., "High Performance Chemically Amplified Positive Electron-Beam Resist: Optimization of Base Additives for Environmental Stabilization," Journal of Photopolymer Science and Technology, vol. 9, No. 4, 1996, pp. 677-684.

S. Funato et al., "Photodecomposable Bases: A Novel Concept to Stabilize Chemically Amplified Resists," Journal of Photopolymer Science Technology, vol. 8, No. 4, 1995, pp. 543-554.

Jiro Nakamura et al., "Effect of Overcoats on Environmental Stability of a Chemically Amplified Positive Resist Against Water and Organic Bases," Journal of Photopolymer Science and Technology, vol. 8, No. 4, 1995, pp. 555-560.

Akira Oikawa et al., "Stabilization of the Chemically Amplified Resist Process," Journal of Photopolymer Science and Technology, vol. 8, No. 4, 1995, pp. 519-524.

WPI Abstract, EP 0290916 A2.

WPI Abstract, DE 4117127 A1.

WPI Abstract, DE 4415113 A1.

Japan Patent Abstract, Publication No. 08305032, dated Nov. 22, 1996.

* cited by examiner

PROCESS FOR FORMING A FINE PATTERN USING A TOP-COATING COMPOSITION FOR A PHOTORESIST AND PRODUCT FORMED BY SAME

CROSS-REFERENCES TO RELATED APPLICATIONS

This is a divisional application of U.S. patent application Ser. No. 10/174,497, filed Jun. 17, 2002 now U.S. Pat. No. 6,984,482, which is a Continuation-in-Part of U.S. patent application No. 09/577,097, filed May 24, 2000, now abandoned, which claims the priority benefit of Korean Application No. 99-20538, filed Jun. 3, 1999, all of which are incorporated herein by reference in their entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

1. Field of the Invention

The present invention relates to a top-coating composition, for a photolithography process, and a process for forming a pattern using the same.

2. Description of the Background Art

Chemical amplification-type DUV photoresists have been used to achieve high sensitivity in minute image formation processes for preparing semiconductor devices. Such photoresists are prepared by blending a photoacid generator and a matrix resin polymer having an acid labile group.

It is believed that when a photoresist (sometimes referred to as "PR") composition is illuminated by an appropriate light source the photoacid generator generates acid. The resin (i.e., polymer) which is present in the photoresist decomposes or becomes cross-linked when reacted with the generated acid. This change in the resin results in the solubility differences in the developing solution between the exposed portion and the unexposed portion. Thus, by using an appropriate mask, one can form a predetermined pattern using the photoresist composition.

In a lithography process, the image resolution generally depends on the wavelength of the light source, e.g., a shorter wavelength allows a more minute image pattern formation.

Lithography processes employing light sources having a wavelength below 250 nm have been recently investigated. In particular, there have been a lot of interests directed to a polymer containing alicyclic derivatives in its main or branched chain as a suitable photoresist polymer. However, utilizing these alicyclic polymers to a semiconductor fabrication process has many disadvantages. For example, chemical properties of the alicyclic polymer vary. In addition, the generated acid may be neutralized by environmental amine compounds during the time between the exposure and the post exposure baking (i.e., "post exposure delay effect"). As a result, a desired resolution are often not obtained and/or the pattern can be T-shaped (i.e., "T-topping"). One or more of these problems are especially acute when the concentration of environmental amine is over 30 ppb, which in some instances may lead to no pattern formation.

In order to overcome the aforementioned disadvantages, the following methods have been suggested in the prior art:

(1) An annealing method whereby the PR resin is baked over its glass transition temperature (Tg) after the PR is coated [see W. D. Hinsberg, S. A. MacDonald, N. J. Clecak, C. D. Snyder, and H. Ito, *Proc. SPIE,* 1925, (1993) 43; H. Ito, W. P. England, R. Sooriyakumaran, N. J. Clecak, G. Breyta, W. D. Hinsberg, H. Lee, and D. Y. Yoon, *J. Photopolymer Sci. and Technol.,* 6, (1993) 547; G. Breyta, D. C. Hofer, H. Ito, D. Seeger, K. Petrillo, H. Moritz, and T. Fischer, *J. Photopolymer Sci. and Technol.,* 7, (1994) 449; H. Ito, G. Breyta, D. Hofer, R. Sooriyakumaran, K. Petrillo, and D. Seeger, *J. Photopolymer Sci. and Technol.,* 7, (1994) 433; H. Ito, G. Breyta, R. Sooriyakumaran, and D. Hofer, *J. Photopolymer Sci. and Technol.,* 8, (1995) 505];

(2) Adding an amine compound to the PR [see Y. Kawai, A. Otaka, J. Nakamura, A. Tanaka, and T. Matsuda, *J. Photopolymer Sci. and Technol.,* 8, (1995) 535; S. Saito, N. Kihara, T. Naito, M. Nakase, T. Nakasugi, and Y. Kat. *Photopolymer Sci. and Technol.,* 9, (1996) 677; S. Funato, Y. Kinoshita, T. Kuto, S. Masuda, H. Okazaki, M. Padmanaban, K. J. Przybilla, N. Suehiro, and G. Pawlowski, *J. Photopolymer Sci. and Technol.,* 8, (1995) 543]; and (3) Adding a top-coating to the upper portion of the PR to protect it against an environmental amine contamination, after the PR coating step and the baking step [see J. Nakamura, H. Ban, Y. Kawai, and A. Tanaka, *J. Photopolymer Sci. and Technol.,* 8, (1995) 555; A. Oikawa, Y. Hatakenaka, Y. Ikeda, Y. Kokubo, S. Miyata, N. Santoh, and N. Abe, *J. Photopolymer Sci. and Technol.,* 8, (1995) 519].

Even using one or more of these techniques it is difficult to form an ultrafine pattern. In addition, the above methods have other disadvantages, such as adding complication or additional steps to a lithography process.

BRIEF SUMMARY OF THE INVENTION

Accordingly, an object of the present invention is to provide a top-coating composition containing an amine contamination-protecting compound that can solve the above-mentioned problems, and a process for forming a photoresist pattern using the same.

DETAILED DESCRIPTION OF THE INVENTION

The present invention provides a top-coating composition, which is useful in a photolithography process, and a process for forming a pattern using the same. In particular, the present invention provides a top-coating composition for protecting amine-contamination and a method for forming a fine pattern by using the same. Compositions and methods of the present invention are particularly useful in a photolithography process utilizing a light sources having an ultrashort wavelength below 250 nm.

Specifically, the present invention provides an amine contamination-protecting top-coating composition comprising a top-coating material and an amine contamination-protecting compound which has a basic or weakly basic property (i.e., a basic compound). The present invention also provides a method for forming a fine pattern by using the same.

Any of the commercially available top-coating compositions for producing semiconductor devices can be used in the present invention. Such top-coating compositions are well known to one skilled in the art. Examples of such top-coating compositions are sold under the designations "NFC 540" by Japan Synthetic Rubber in Japan, and "Aquatar" by Clariant Inc. in Switzerland.

The amine contamination-protecting compound of the present invention is a basic compound, preferably weakly basic compound, more preferably a water-soluble compound including cyclic and acyclic nitrogen-containing compounds. Exemplary nitrogen-containing compounds which are useful in the present invention include amine derivatives; amino acid derivatives; amide derivatives; urethane derivatives; urea derivatives; and salts thereof. The amount of amine contamination-protecting compound present in the composition of the present invention is preferably from about 0.015 to about 0.5 weight % relative to the amount of top-coating composition.

Preferably, the conjugate acid (i.e., a protonated form) of the basic compound has pKa of about 8 or less.

In one particular embodiment, the amine contamination-protecting compound is a compound of formula I:

where each of $R_1$, $R_2$ and $R_3$ is independently H or $C_1$-$C_{20}$ alkyl. Alkyl groups according to the present invention are aliphatic hydrocarbons which can be straight or branched chain groups. Alkyl groups optionally can be substituted with one or more substituents, such as a halogen, alkenyl, alkynyl, aryl, hydroxy, amino, thio, alkoxy, carboxy, oxo or cycloalkyl. There may be optionally inserted along the alkyl group one or more oxygen, sulfur or substituted or unsubstituted nitrogen atoms. Preferred alkyl groups include unsubstituted alkyl groups and substituted alkyl groups containing one or more hydroxy, amine, and/or carbonyl (such as ketone, carboxylic acid, and ester) groups, i.e., straight or branched $C_1$-$C_{20}$ alkyl, straight or branched $C_1$-$C_{20}$ alcohol (—OH), straight or branched $C_1$-$C_{20}$ carboxylic acid, straight or branched $C_1$-$C_{20}$ amine, straight or branched $C_1$-$C_{20}$ ketone, or straight or branched $C_1$-$C_{20}$ ester.

In one aspect of the present invention, the amine contamination-protecting compound comprises an amino acid, in particular L-proline (i.e., compound of formula II), triethanolamine (i.e., compound of formula III), and mixtures thereof. Preferably, the amine contamination-protecting compound comprises triethanolamine.

In another embodiment, the amine contamination-protecting compound is preferably selected from the group consisting of aniline, p-nitroaniline, p-aminotoluene, 3-amino-1-propanesulfonic acid, 4-aminotoluene-5-sulfonic acid, 4-aminosalicyclic acid, 4-aminophenol, 2-amino-2-norbornanecarboxylic acid, 2-aminonicotinic acid, 2-aminobutyric acid, alanine, aspartic acid, cysteine, glutamine, serine and mixtures thereof.

It has been discovered by the present inventors, that when a top-coating step is carried out using the amine contamination-protecting top-coating composition of the present invention, an ultrafine pattern having an excellent profile can be formed. Without being bound by any theory, it is believed that the amine contamination-protecting top-coating composition of the present invention effectively intercepts environmental amine contamination during the post exposure delay (hereinafter, referred to as 'PED'), and prevents acid, which is generated by the light exposure, from diffusing into an unexposed area. That is, when an amine contamination-protecting compound of the present invention is added to a conventional top-coating composition, the resulting amine contamination-protecting top-coating composition has a suitable basic property to act as a buffer to prevent the acid generated at the exposed area from being contaminated by the environmental amine compounds. In addition, the amine contamination-protecting top-coating composition of the present invention is coated at the upper portion of the PR. It is believed that the amine contamination-protecting compound contained in the amine contamination-protecting top-coating composition of the present invention restricts acid diffusion on the PR surface, thereby providing a superior pattern (i.e., image having a vertical profile).

Additional objects, advantages, and novel features of this invention will become apparent to those skilled in the art upon examination of the following examples thereof, which are not intended to be limiting.

EXAMPLES

In order to confirm the effects of the top-coating composition according to the present invention, a PR pattern is formed in the following Examples by employing a top-coating process which comprises:

(a) coating a photoresist composition on a substrate to form a photoresist film;

(b) coating a top-coating composition on the upper portion of the photoresist film to form a top-coating;

(c) exposing the resultant coated substrate to light using an exposer; and (d) developing the resultant product.

The PR composition used above is prepared by dissolving (i) poly(2-hydroxyethyl 5-norbornene-2-carboxylic acid/tert-butyl 5-norbornene-2-carboxylate/5-norbornene-2-carboxylic acid/maleic anhydride), (ii) a photoacid generator and (iii) certain other optional additives in (iv) propylene glycol methyl ether acetate (PGMEA) solvent [see J. C. Jung, C. K. Bok, and K. H. Baik, *J. Photopolymer Sci. and Technol.*, 10, (1997) 529; J. C. Jung, C. K. Bok, and K. H. Baik, *Proc. SPIE*, 3333, (1998) 11; J. C. Jung, M. H. Jung, and K. H. Baik, *J. Photopolymer Sci. and Technol.*, 11, (1998) 481].

The amine contamination-protecting top-coating composition in the Invention Examples is prepared by adding the amine contamination-protecting compound to a conventional top-coating composition.

All the pattern formation experiments are performed under a condition having the environmental amine concentration of over 15 parts per billion (ppb).

Comparative Example 1

At an environmental amine concentration of 15 ppb, the PR composition is coated on the substrate, baked at 110° C. for 90 seconds, and cooled at 23° C.

Thereafter, an NFC 540 top-coating material manufactured by Japan Synthetic Rubber in Japan (hereinafter, referred to as 'JSR') is coated as a top-coating composition on the upper portion of the PR coating, baked at 60° C. for 60 seconds and cooled.

Figure 1:
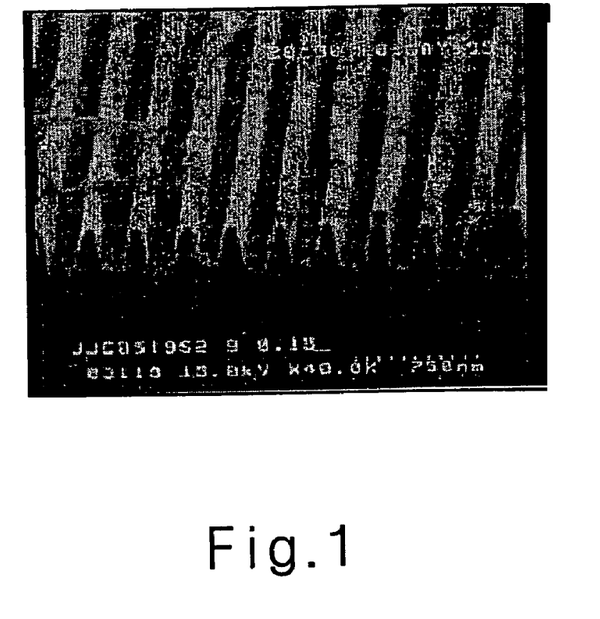
FIGS. 1 and 2 are SEM photographs showing a conventional photoresist pattern.

The resultant product is exposed to light by an ArF exposer, baked at 110° C. for 90 seconds, and developed in 2.38 wt % TMAH solution, thereby obtaining the 150 nm pattern shown in FIG. 1.

As shown in FIG. 1, the upper portion of the pattern is considerably damaged, and the vertical profile thereof is not complete. It is believed that this results from acid diffusion to the unexposed area during the PED.

Comparative Example 2

At an environmental amine concentration of 15 ppb, the PR composition is coated on the substrate, baked at 110° C. for 90 seconds, and cooled at 23° C.

Thereafter, an Aquatar top-coating material manufactured by Clariant Inc. in Switzerland is coated on the upper portion of the PR coating, baked at 60° C. for 60 seconds and cooled.

Figure 2:
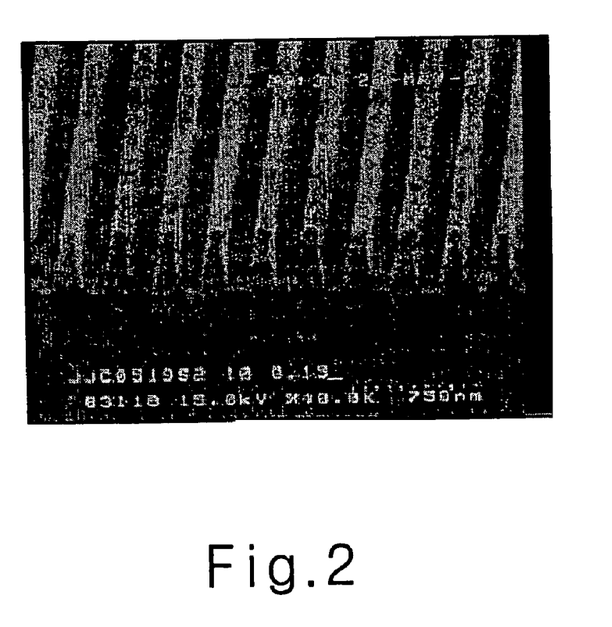

The resultant product is exposed to light by the ArF exposer, baked at 110° C. for 90 seconds, and developed in the 2.38 wt % TMAH solution, thereby obtaining the 150 nm pattern shown in FIG. 2.

As illustrated in FIG. 2, the upper portion of the pattern is considerably damaged as in FIG. 1, and the developing state of the exposed area is not complete.

Invention Example 1

A novel amine contamination-protecting top-coating composition of the present invention is first prepared by blending 20 g of NFC 540 (a top-coating material manufactured by JSR) and 0.016 g of L-proline.

The PR pattern is formed by repeating the procedure of Comparative Example 1 but using the above-described composition as the amine contamination-protecting top-coating composition. Briefly, at the environmental amine concentration of about 15 ppb, the PR composition is coated on the substrate, baked at 110° C. for 90 seconds, and cooled at 23° C.

Thereafter, the amine contamination-protecting top-coating composition is coated on the upper portion of the PR coating baked at 60° C. for 60 seconds and cooled.

Figure 3:
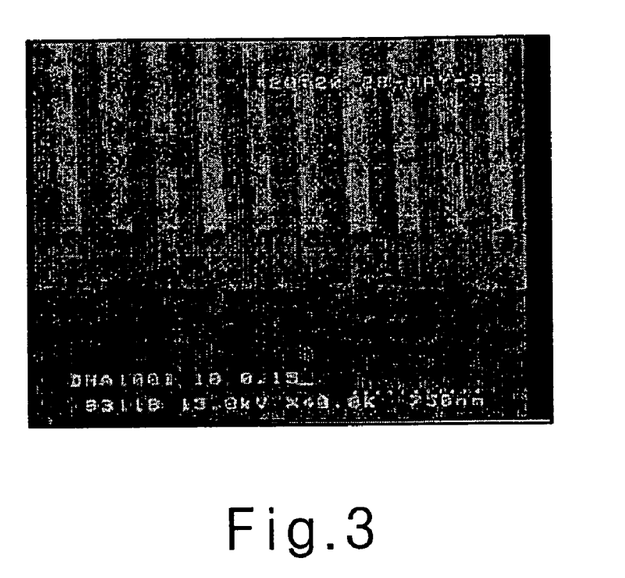
FIGS. 3 to 20 are SEM photographs showing a photoresist pattern in accordance with a preferred example of the present invention.

The resultant product is exposed to light by the ArF exposer, baked at 110° C. for 90 seconds, and developed in the 2.38 wt % TMAH solution, to produce the 150 nm pattern shown in FIG. 3.

Compared to FIG. 1, the upper portion of the pattern in FIG. 3 is significantly less damaged and shows a significantly improved vertical profile.

Invention Example 2

A novel amine contamination-protecting top-coating composition of the present invention is prepared by blending 20 g of Aquatar (a top-coating material manufactured by Clariant Inc.) and 0.016 g of L-proline.

Figure 4:
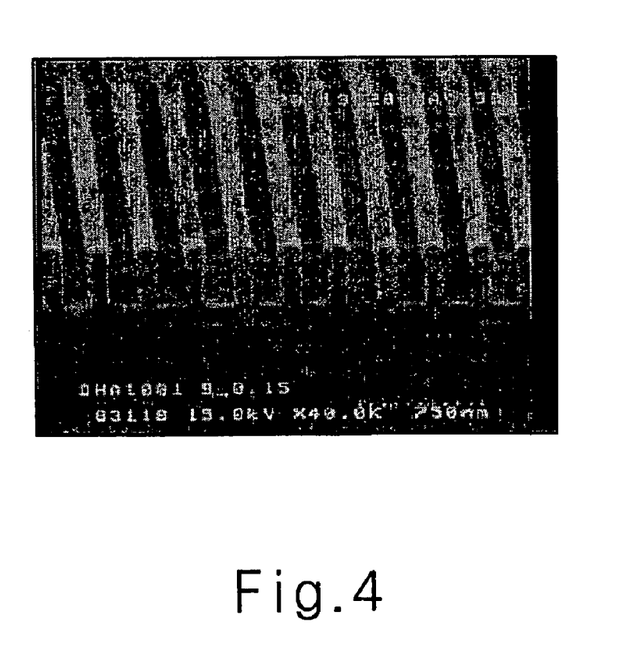

The top-coating process is performed by repeating the procedure of Comparative Example 2 but using the aforementioned amine contamination-protecting top-coating composition. The lithography process described in Comparative Example 2 produced the 150 nm PR pattern shown in FIG. 4. Compared to FIG. 2, the upper portion of the pattern of FIG. 4 is significantly less damaged, and the vertical profile thereof is significantly improved.

Invention Example 3

A novel amine contamination-protecting top-coating composition of the present invention is prepared by blending 20 g of Aquatar (a top-coating material manufactured by Clariant Inc.) and 0.020 g of triethanolamine.

Figure 5:
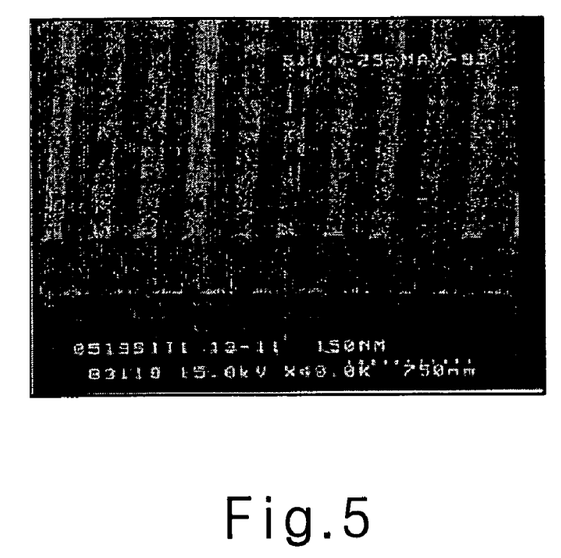

The top-coating process is performed by repeating the procedure of Comparative Example 2 but using the aforementioned amine contamination-protecting top-coating composition to produce the 150 nm PR pattern shown in FIG. 5. Compared to FIG. 2, the upper portion of the pattern in FIG. 5 is significantly less damaged, and the vertical profile thereof is significantly improved.

Invention Example 4

A novel amine contamination-protecting top-coating composition of the present invention is prepared by blending 200 g of NFC 540 (a top-coating material manufactured by JSR) and 0.113 g of aniline.

Figure 6:
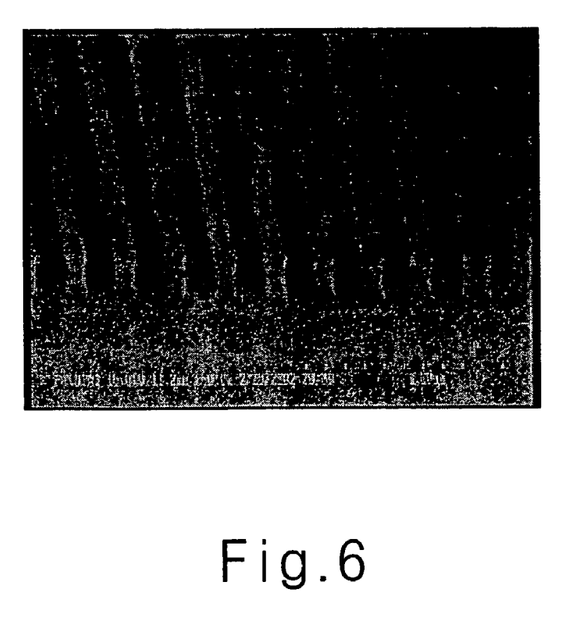

The lithography process is carried out in the same manner as Comparative Example 1 using the above-described amine contamination-protecting top-coating composition to produce the 150 nm pattern depicted in FIG. 6.

Compared to FIG. 1, the upper portion of the pattern in FIG. 6 is significantly less damaged and shows a significantly improved vertical profile.

Invention Example 5

A novel amine contamination-protecting top-coating composition of the present invention is prepared by blending 200 g of NFC 540 (a top-coating material manufactured by JSR) and 0.17 g of p-nitroaniline.

Figure 7:
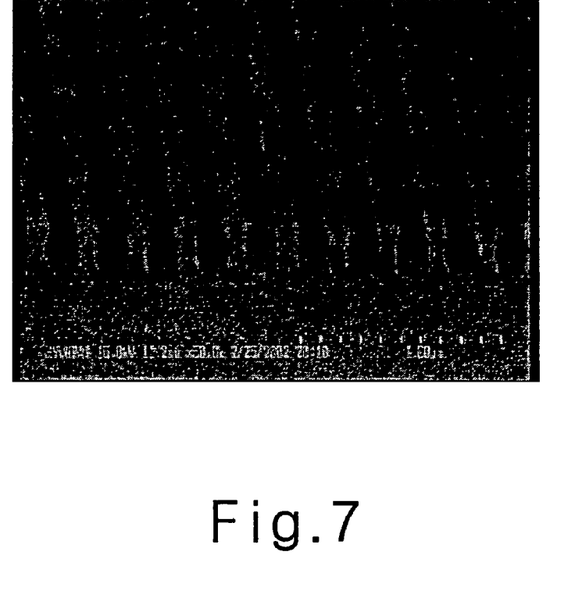

The lithography process is carried out in the same manner as Comparative Example 1 using the above-described amine contamination-protecting top-coating composition to produce the 150 nm pattern depicted in FIG. 7.

Compared to FIG. 1, the upper portion of the pattern in FIG. 7 is significantly less damaged and shows a significantly improved vertical profile.

Invention Example 6

A novel amine contamination-protecting top-coating composition of the present invention is prepared by blending 200 g of NFC 540 (a top-coating material manufactured by JSR) and 0.131 g of p-aminotoluene.

Figure 8:
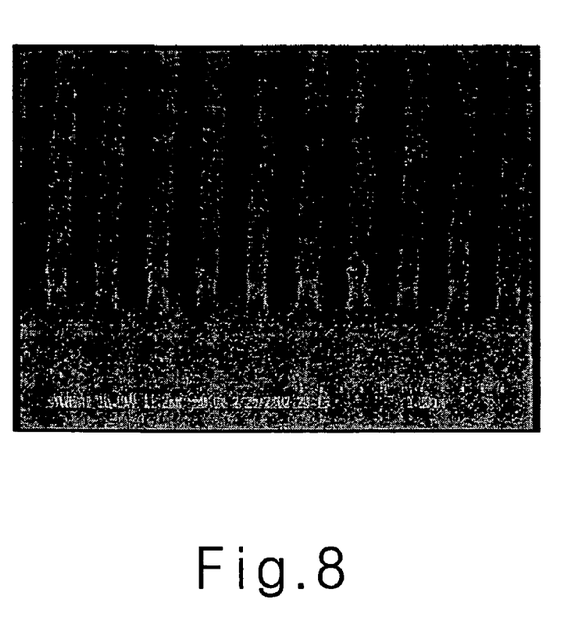

The lithography process is carried out in the same manner as Comparative Example 1 using the above-described amine contamination-protecting top-coating composition to produce the 150 nm pattern depicted in FIG. 8.

Compared to FIG. 1, the upper portion of the pattern in FIG. 8 is significantly less damaged and shows a significantly improved vertical profile.

Invention Example 7

A novel amine contamination-protecting top-coating composition of the present invention is prepared by blending 200 g of NFC 540 (a top-coating material manufactured by JSR) and 0.17 g of 3-amino-1-propanesulfonic acid.

Figure 9:
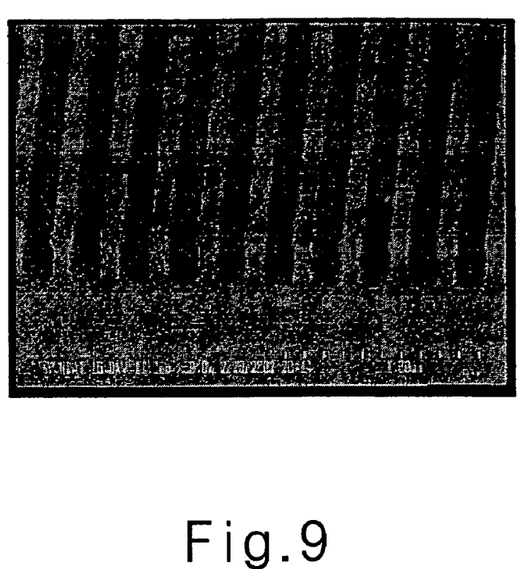

The lithography process is carried out in the same manner as Comparative Example 1 using the above-described amine contamination-protecting top-coating composition to produce the 150 nm pattern depicted in FIG. 9.

Compared to FIG. 1, the upper portion of the pattern in FIG. 9 is significantly less damaged and shows a significantly improved vertical profile.

Invention Example 8

A novel amine contamination-protecting top-coating composition of the present invention is prepared by blending 200 g of NFC 540 (a top-coating material manufactured by JSR) and 0.23 g of 4-aminotoluene-5-sulfonic acid.

Figure 10:
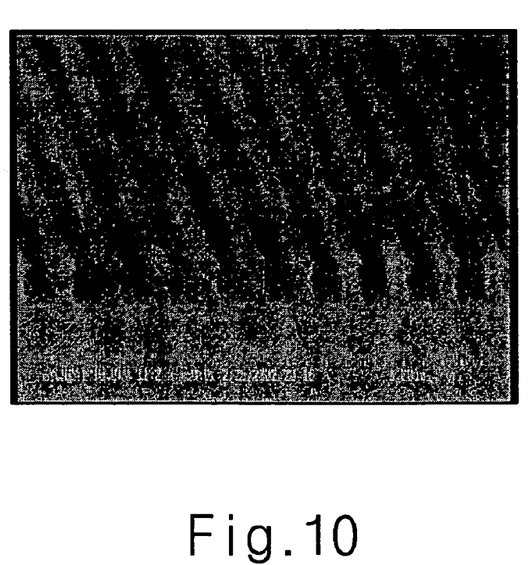

The lithography process is carried out in the same manner as Comparative Example 1 using the above-described amine contamination-protecting top-coating composition to produce the 150 nm pattern depicted in FIG. 10.

Compared to FIG. 1, the upper portion of the pattern in FIG. 10 is significantly less damaged and shows a significantly improved vertical profile.

Invention Example 9

A novel amine contamination-protecting top-coating composition of the present invention is prepared by blending 200 g of NFC 540 (a top-coating material manufactured by JSR) and 0.19 g of 4-aminosalicyclic acid.

Figure 11:
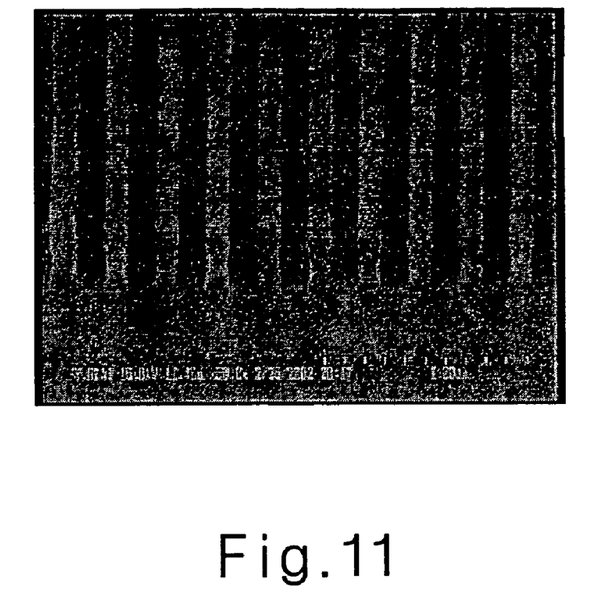

The lithography process is carried out in the same manner as Comparative Example 1 using the above-described amine contamination-protecting top-coating composition to produce the 150 nm pattern depicted in FIG. 11.

Compared to FIG. 1, the upper portion of the pattern in FIG. 11 is significantly less damaged and shows a significantly improved vertical profile.

Invention Example 10 novel amine contamination-protecting top-coating composition of the present invention is prepared by blending 200 g of NFC 540 (a top-coating material manufactured by JSR) and 0.13 g of 4-aminophenol.

Figure 12:
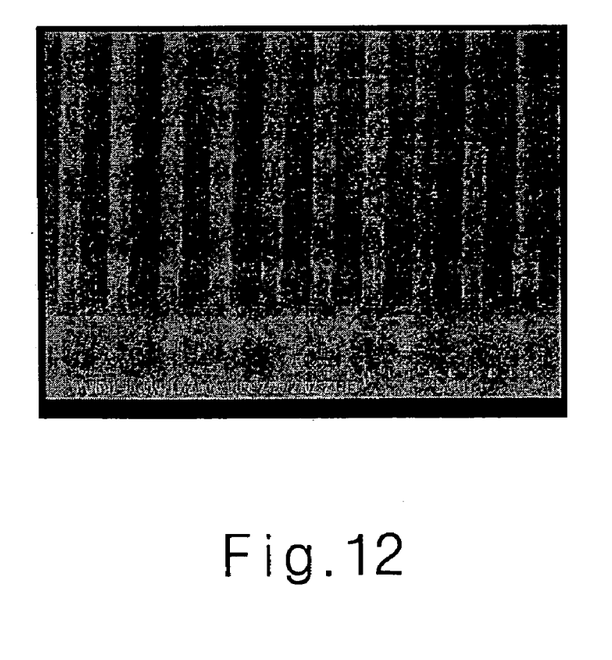

The lithography process is carried out in the same manner as Comparative Example 1 using the above-described amine contamination-protecting top-coating composition to produce the 150 nm pattern depicted in FIG. 12.

Compared to FIG. 1, the upper portion of the pattern in FIG. 12 is significantly less damaged and shows a significantly improved vertical profile.

Invention Example 11

A novel amine contamination-protecting top-coating composition of the present invention is prepared by blending 200 g of NFC 540 (a top-coating material manufactured by JSR) and 0.19 g of 2-amino-2-norbornanecarboxylic acid.

Figure 13:
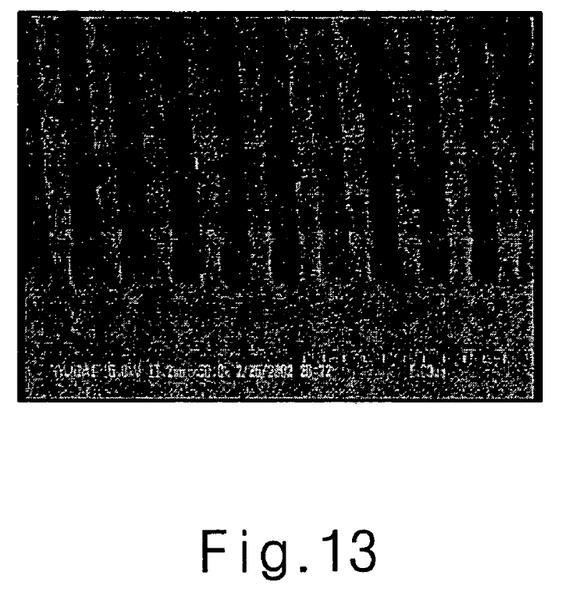

The lithography process is carried out in the same manner as Comparative Example 1 using the above-described amine contamination-protecting top-coating composition to produce the 150 nm pattern depicted in FIG. 13.

Compared to FIG. 1, the upper portion of the pattern in FIG. 13 is significantly less damaged and shows a significantly improved vertical profile.

Invention Example 12

A novel amine contamination-protecting top-coating composition of the present invention is prepared by blending 200 g of NFC 540 (a top-coating material manufactured by JSR) and 0.17 g of 2-aminonicotinic acid.

Figure 14:
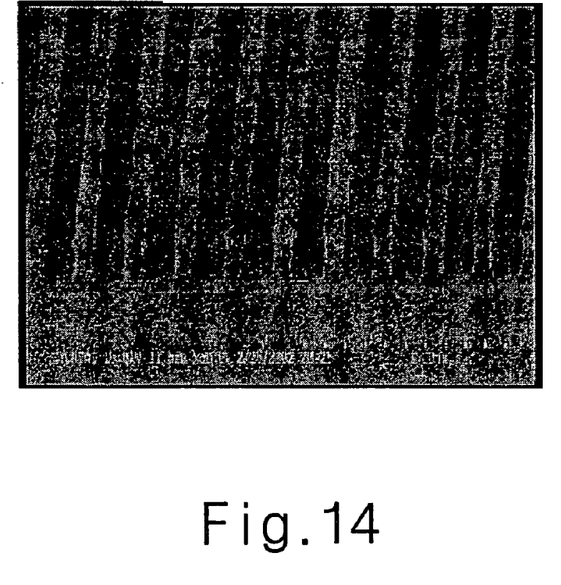

The lithography process is carried out in the same manner as Comparative Example 1 using the above-described amine contamination-protecting top-coating composition to produce the 150 nm pattern depicted in FIG. 14.

Compared to FIG. 1, the upper portion of the pattern in FIG. 14 is significantly less damaged and shows a significantly improved vertical profile.

Invention Example 13

A novel amine contamination-protecting top-coating composition of the present invention is prepared by blending 200 g of NFC 540 (a top-coating material manufactured by JSR) and 0.13 g of 2-aminobutyric acid.

Figure 15:
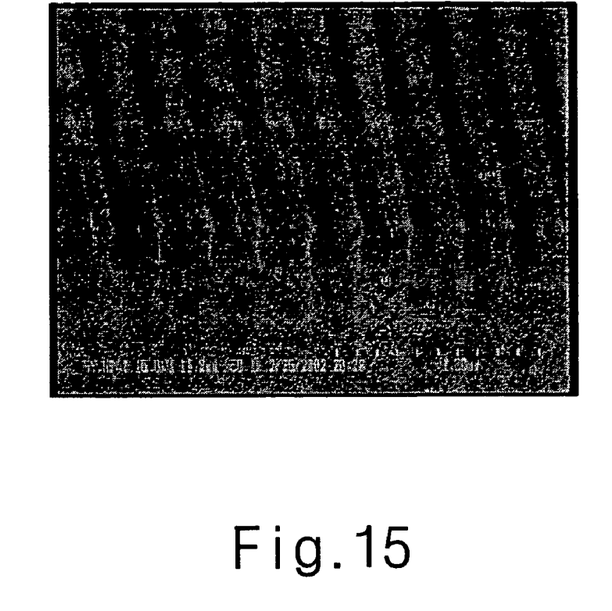

The lithography process is carried out in the same manner as Comparative Example 1 using the above-described amine contamination-protecting top-coating composition to produce the 150 nm pattern depicted in FIG. 15.

Compared to FIG. 1, the upper portion of the pattern in FIG. 15 is significantly less damaged and shows a significantly improved vertical profile.

Invention Example 14

A novel amine contamination-protecting top-coating composition of the present invention is prepared by blending 200 g of NFC 540 (a top-coating material manufactured by JSR) and 0.108 g of alanine.

Figure 16:
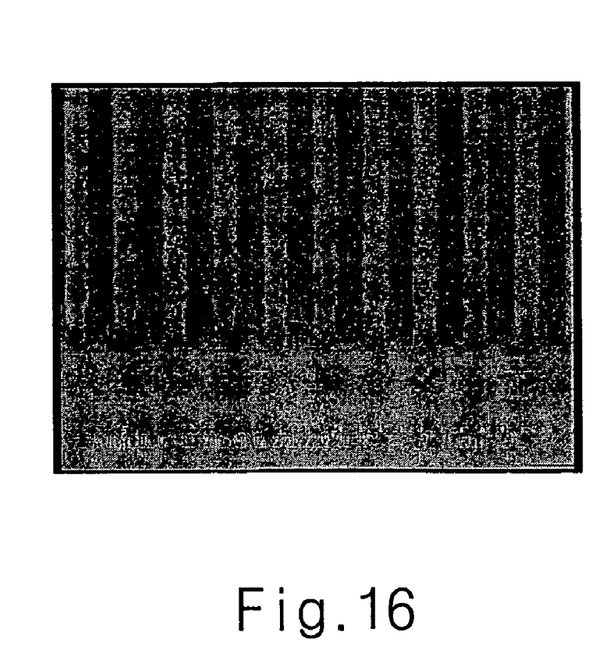

The lithography process is carried out in the same manner as Comparative Example 1 using the above-described amine contamination-protecting top-coating composition to produce the 150 nm pattern depicted in FIG. 16.

Compared to FIG. 1, the upper portion of the pattern in FIG. 16 is significantly less damaged and shows a significantly improved vertical profile.

Invention Example 15

A novel amine contamination-protecting top-coating composition of the present invention is prepared by blending 200 g of NFC 540 (a top-coating material manufactured by JSR) and 0.162 g of aspartic acid.

Figure 17:
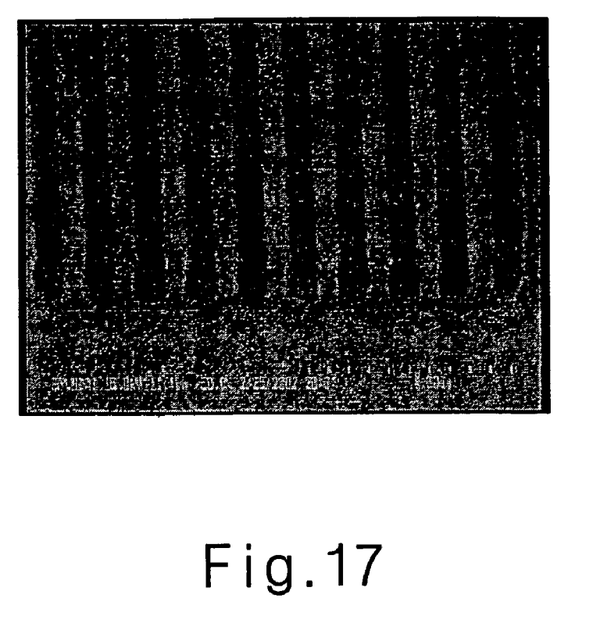

The lithography process is carried out in the same manner as Comparative Example 1 using the above-described amine contamination-protecting top-coating composition to produce the 150 nm pattern depicted in FIG. 17.

Compared to FIG. 1, the upper portion of the pattern in FIG. 17 is significantly less damaged and shows a significantly improved vertical profile.

Invention Example 16

A novel amine contamination-protecting top-coating composition of the present invention is prepared by blending 200 g of NFC 540 (a top-coating material manufactured by JSR) and 0.147 g of cysteine.

Figure 18:
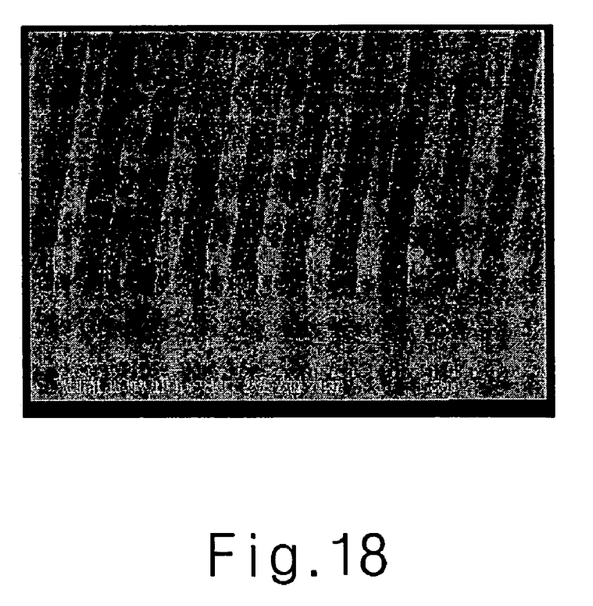

The lithography process is carried out in the same manner as Comparative Example 1 using the above-described amine contamination-protecting top-coating composition to produce the 150 nm pattern depicted in FIG. 18.

Compared to FIG. 1, the upper portion of the pattern in FIG. 18 is significantly less damaged and shows a significantly improved vertical profile.

Invention Example 17

A novel amine contamination-protecting top-coating composition of the present invention is prepared by blending 200 g of NFC 540 (a top-coating material manufactured by JSR) and 0.18 g of glutamine.

Figure 19:
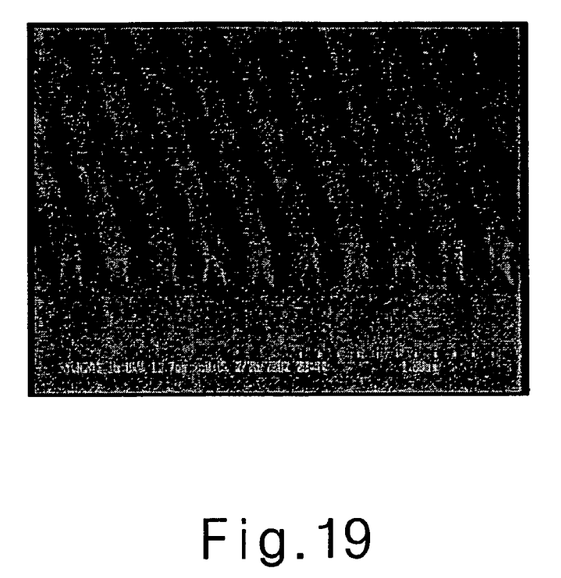

The lithography process is carried out in the same manner as Comparative Example 1 using the above-described amine contamination-protecting top-coating composition to produce the 150 nm pattern depicted in FIG. 19.

Compared to FIG. 1, the upper portion of the pattern in FIG. 19 is significantly less damaged and shows a significantly improved vertical profile.

Invention Example 18

A novel amine contamination-protecting top-coating composition of the present invention is prepared by blending 200 g of NFC 540 (a top-coating material manufactured by JSR) and 0.128 g of serine.

Figure 20:
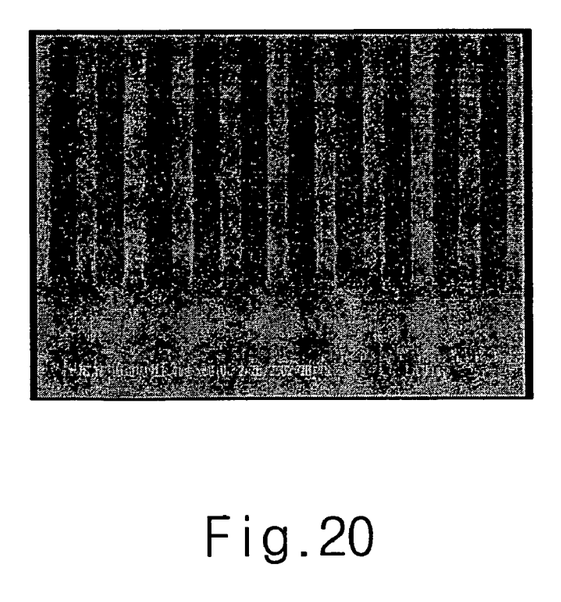

The lithography process is carried out in the same manner as Comparative Example 1 using the above-described amine contamination-protecting top-coating composition to produce the 150 nm pattern depicted in FIG. 20.

Compared to FIG. 1, the upper portion of the pattern in FIG. 20 is significantly less damaged and shows a significantly improved vertical profile.

While Invention Examples 1-18 describe using ArF radiation as the exposure light source, other light sources, including the ultrashort wavelength light sources such as KrF (248 nm), $F_2$(157 nm), E-beam, ion beam and extremely ultraviolet (EUV), can also be employed.

In addition to the above-described PR composition, other conventional PR compositions known to one of ordinary skill in the art can also be used. Lithography conditions used in the Examples may vary, if necessary.

The results obtained from the above Examples show that amine contamination during PED and pattern deformation on the top surface of the PR layer because of acid diffusion can be significantly reduced or prevented by adding an amine contamination-protecting compound to a conventional top-coating composition in accordance with the present invention.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A process for forming a photoresist pattern, comprising the steps of:
   (a) coating a photoresist composition comprising a photoacid generator and a photoresist polymer having an acid labile group on a substrate to form a photoresist film;
   (b) coating an amine contamination-protecting top-coating composition for photoresist on the upper portion of the photoresist film to form a top-coating;
   (c) exposing the top-coated substrate to light by using an exposer, whereby acid generated by the photoacid generator reacts with the polymer to induce solubility differences in a developing solution between the exposed portions and unexposed portions of the photoresist film; and
   (d) developing the exposed substrate with a developing solution to form a predetermined pattern by removing the exposed or unexposed portions of the photoresist film;
   wherein the amine contamination-protecting top-coating composition for photoresist comprises (i) a top-coating composition and (ii) a basic compound of which conjugate acid has pKa of about 8 or less in an amount equal to 0.015-0.5% by weight of the top-coating composition.

2. The process according to claim 1, wherein (c) the exposer comprises a light source which is capable of generating ultrashort wavelength below 250 nm.

3. The process according to claim 2, wherein the light source is selected from the group consisting of KrF (248 nm), ArF (193 nm), F2(157 nm), L-beam, ion beam and extremely ultraviolet (EUV).

4. The process according to claim 1, wherein said (i) top-coating composition comprises a water soluble solvent and a water soluble organic resin.

5. The process according to claim 1, wherein said (ii) basic compound is a nitrogen containing compound.

6. The process according to claim 5, wherein said (ii) basic compound is selected from the group consisting of L-proline, aniline, p-nitroaniline, p-aminotoluene, 3-amino-1-propanesulfonic acid, 4-aminotoluene-5-sulfonic acid, 4-aminosalicylic acid, 4-aminophenol, 2-amino-2-norbomanecarboxylic acid, 2-aminonicotinic acid, 2-aminobutyrix acid-, alanine, aspartic acid, cysteine, glutamine, serine and mixtures thereof.

7. A semiconductor element manufactured by employing the process according to claim 1.

\* \* \* \* \*